(12) United States Patent
Akiyama et al.

(10) Patent No.: US 10,329,453 B2
(45) Date of Patent: Jun. 25, 2019

(54) FILM-FORMING COMPOSITION, METHOD FOR PRODUCING SURFACE-TREATED METAL MEMBER, AND METHOD FOR PRODUCING METAL-RESIN COMPOSITE

(71) Applicant: MEC COMPANY LTD., Amagasaki-shi, Hyogo (JP)

(72) Inventors: Daisaku Akiyama, Hyogo (JP); Yoichi Sengoku, Hyogo (JP); Itsuro Tomatsu, Hyogo (JP); Masao Okada, Hyogo (JP); Ryoko Mitani, Hyogo (JP); Keisuke Joko, Hyogo (JP); Yasutaka Amitani, Hyogo (JP); Tokuya Satomi, Hyogo (JP); Masaru Takahashi, Hyogo (JP)

(73) Assignee: MEC COMPANY LTD., Hyogo (JP)

( * ) Notice: Subject to any disclaimer, the term of this patent is extended or adjusted under 35 U.S.C. 154(b) by 0 days.

(21) Appl. No.: 16/096,827

(22) PCT Filed: Mar. 13, 2017

(86) PCT No.: PCT/JP2017/009992
§ 371 (c)(1),
(2) Date: Oct. 26, 2018

(87) PCT Pub. No.: WO2017/195456
PCT Pub. Date: Nov. 16, 2017

(65) Prior Publication Data
US 2019/0127606 A1 May 2, 2019

(30) Foreign Application Priority Data

May 10, 2016 (JP) ................................. 2016-094536

(51) Int. Cl.
*C09D 183/04* (2006.01)
*B32B 15/08* (2006.01)
(Continued)

(52) U.S. Cl.
CPC ............ *C09D 183/04* (2013.01); *B32B 15/08* (2013.01); *C09D 7/63* (2018.01); *C09J 11/08* (2013.01);
(Continued)

(58) Field of Classification Search
CPC ..................................................... C09D 183/04
See application file for complete search history.

(56) References Cited

U.S. PATENT DOCUMENTS

| 2010/0108531 A1 | 5/2010 | Kawaguchi et al. |
| 2015/0152124 A1* | 6/2015 | Mori ..................... C07F 7/1804 428/457 |

FOREIGN PATENT DOCUMENTS

| EP | 2 514 853 | 10/2012 |
| JP | 7-258870 | 10/1995 |

(Continued)

OTHER PUBLICATIONS

International Search Report dated May 30, 2017 in International Application No. PCT/JP2017/009992.
(Continued)

*Primary Examiner* — Daniel H Lee
(74) *Attorney, Agent, or Firm* — Wenderoth, Lind & Ponack, L.L.P.

(57) ABSTRACT

The coating film-forming composition is a solution of pH 6 to 9 and includes an aromatic compound having an amino group and an aromatic ring in one molecule, a polybasic acid having two or more carboxy groups, and a halide ion. The content of polybasic acid in the coating film-forming composition is 0.05 to 10 times the content of aromatic compound, and the halide ion concentration is 5 to 600 mM. A coating film with excellent adhesion to a resin can be formed
(Continued)

on a surface of a metal member by bringing the coating film-forming composition into contact with the surface of the metal member.

7 Claims, 1 Drawing Sheet

(51) Int. Cl.
    *C09J 11/08*     (2006.01)
    *C09J 183/04*     (2006.01)
    *C09D 7/63*     (2018.01)

(52) U.S. Cl.
    CPC ......... *C09J 183/04* (2013.01); *B32B 2255/06* (2013.01); *B32B 2255/24* (2013.01)

(56) References Cited

FOREIGN PATENT DOCUMENTS

| | | |
|---|---|---|
| JP | 2000-286546 | 10/2000 |
| JP | 2008-13666 | 1/2008 |
| JP | 2010-111748 | 5/2010 |
| JP | 2010-285535 | 12/2010 |
| JP | 2015-214743 | 12/2015 |
| JP | 2016-56449 | 4/2016 |
| WO | 2013/186941 | 12/2013 |
| WO | 2018/135203 | 7/2018 |

OTHER PUBLICATIONS

Extended European Search Report dated Apr. 8, 2019 in European Patent Application No. 17795817.0.

* cited by examiner

FILM-FORMING COMPOSITION, METHOD FOR PRODUCING SURFACE-TREATED METAL MEMBER, AND METHOD FOR PRODUCING METAL-RESIN COMPOSITE

TECHNICAL FIELD

The present invention relates to a coating film-forming composition for forming a coating film on a surface of a metal member for improving adhesion to a resin. Further, the present invention relates to a method for producing a surface-treated metal member using the coating film-forming composition, and also to a method for producing a metal-resin composite.

BACKGROUND ART

In the printed wiring board production process, a resin material such as an etching resist, a plating resist, a solder resist, or a prepreg is joined to the surface of a metal layer or a metal trace. In the printed wiring board production process and also in the produced products, high adhesion is required between the metal and the resin. Examples of the known method for improving adhesion between a metal and a resin are the followings: forming fine irregularities on a metal surface using a roughening agent (microetching agent); forming a coating film for improving adhesion to a resin (adhesive layer) on the surface of a metal; forming an adhesive layer on a roughened surface.

For example, Patent Document 1 discloses that an adhesion between the copper circuit and an epoxy resin can be improved when the surface of a copper circuit is subjected to a roughening treatment with an acidic aqueous solution containing copper ion, and then treated with an aqueous solution containing an organic acid, a benzotriazole-based antirust agent, and a silane coupling agent. Patent Document 2 and Patent Document 3 disclose that an adhesion between the metal and a resin can be improved by bringing a solution containing a specific silane compound into contact with the metal surface to form a coating film. Patent Document 4 discloses that an adhesion between the metal and a resin can be improved by applying an antirust agent containing a triazole-based compound, a silane coupling agent, and an organic acid to the copper foil surface.

PRIOR ART DOCUMENTS

Patent Documents

Patent Document 1: JP 2000-286546 A
Patent Document 2: JP 2015-214743 A
Patent Document 3: WO 2013/186941
Patent Document 4: JP 7-258870 A

SUMMARY OF THE INVENTION

Problems to be Solved by the Invention

According to the method that forms a coating film using a composition containing a silane coupling agent as described in Patent Documents 2 to 4, it is not necessary to roughen the surface of a metal, and also it is not necessary to dispose an additional metal layer (e.g., tin-plated layer) for improving adhesion. Therefore, such a method is advantageous in that the process of joining a metal and a resin together can be simplified. However, in the conventional compositions, the film formability or film adhesion on a metal surface is poor, and there have been cases where the adhesion between a metal and a resin is insufficient, or the adhesion durability against acids, such as hydrochloric acid, is insufficient.

In view of the above background, an object of the present invention is to provide a coating film-forming composition that is capable of forming a coating film having excellent adhesion to a resin on a metal surface.

Means for Solving the Problems

As a result of research, the present inventors have found that a composition containing a specific aromatic compound has excellent film formability on a metal surface and is also capable of significantly improving metal-resin adhesion.

The coating film-forming composition of the present invention includes an aromatic compound having an amino group and an aromatic ring in one molecule; a polybasic acid having two or more carboxy groups; and a halide ion. The content of the polybasic acid is 0.05 to 10 times the content of the aromatic compound, and the concentration of the halide ion is 5 to 600 mM. The pH of the coating film-forming composition (solution) is 6 to 9.

By bringing the coating film-forming composition described above into contact with a surface of a metal member, a coating film is formed on the metal member surface. The surface-treated metal member having a coating film formed thereon has excellent adhesion to a resin. The metal member may be a copper or copper alloy material.

Effects of the Invention

An adhesion between a metal member and a resin can be improved by forming a coating film on a surface of the metal member, such as copper or a copper alloy, using the coating film-forming composition of the present invention. When the metal member and a resin are joined together with the coating film therebetween, a metal-resin composite having high adhesion durability against acids, such as hydrochloric acid, is obtained.

MODE FOR CARRYING OUT THE INVENTION

[Coating Film-Forming Composition]

Figure 1:
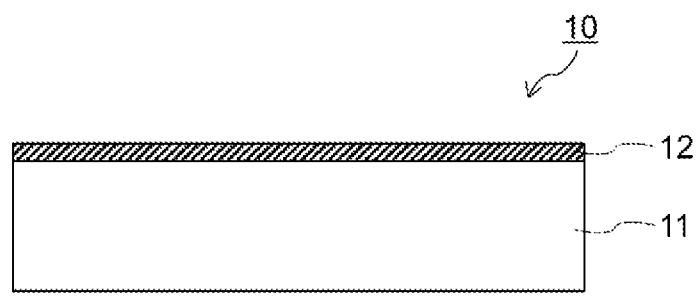
FIG. 1 is a schematic cross-sectional view showing one embodiment of a surface-treated metal member.

The coating film-forming composition of the present invention is used for forming a coating film on a metal surface. The coating film-forming composition is a solution of pH 6 to 9, and contains an aromatic compound having an amino group and an aromatic ring in one molecule, a polybasic acid, and a halide ion. Hereinafter, each component contained in the coating film-forming composition of the present invention will be described.

<Aromatic Compound>

The aromatic compound is a material that serves as a main component of a coating film. The aromatic compound has an amino group and an aromatic ring in one molecule.

The aromatic ring may be composed only of carbon and hydrogen, or may also be a heteroaromatic ring containing a heteroatom such as nitrogen, oxygen, or sulfur. The aromatic ring may be monocyclic or condensed polycyclic.

It is preferable that the aromatic compound contains a nitrogen-containing aromatic ring. Examples of nitrogen-containing aromatic rings include monocyclic rings such as pyrrole, pyrazole, imidazole, triazole, tetrazole, oxazole, oxadiazole, isoxazole, thiazole, isothiazole, furazane, pyridine, pyridazine, pyrimidine, pyrazine, triazine, tetrazine, pentazine, azepine, diazepine, and triazepine; condensed bicyclic rings such as indole, isoindole, thienoindole, indazole, purine, quinoline, isoquinoline, and benzotriazole; condensed tricyclic rings such as carbazole, acridine, β-carboline, acridone, perimizine, phenazine, phenanthridine, phenothiazine, phenoxazine, and phenanthroline; condensed tetracyclic rings such as quindoline and quinindoline; and condensed pentacyclic rings such as acrindoline. Among them, nitrogen-containing aromatic rings containing two or more nitrogen atoms, such as pyrazole, imidazole, triazole, tetrazole, pyridazine, pyrimidine, pyrazine, triazine, tetrazine, and pentazine, are preferable, and imidazole, tetrazole, and triazine are particularly preferable.

The amino group may be primary, secondary, or tertiary, or may also be heterocyclic. The amino group may be directly or indirectly bonded to the aromatic ring. The aromatic compound may have two or more amino groups in one molecule. A nitrogen-containing aromatic ring corresponds to both a heterocyclic amino group and an aromatic ring. Therefore, in the case where the above aromatic ring is a nitrogen-containing aromatic ring, an amino group does not have to be contained separately from the aromatic ring. The aromatic compound preferably has a secondary amino group and/or a primary amino group, and particularly preferably has a primary amino group. Because a coating film having excellent adhesion between a metal and a resin can be formed, it is preferable that the aromatic compound is a compound having a nitrogen-containing aromatic ring and having a primary amino group indirectly bonded to the nitrogen-containing aromatic ring through an alkylene group, an alkylene amino group, or the like.

The aromatic compound is not particularly limited in structure as long as it has an aromatic ring and an amino group, and may also have a functional group other than the amino group, such as a hydroxy group, a carboxy group, an amide group, a cyano group, a nitro group, an azo group, a diazo group, a mercapto group, an epoxy group, a silyl group, a silanol group, or an alkoxysilyl group. In particular, in the case where the aromatic compound has an alkoxysilyl group or a hydroxysilyl group, the aromatic compound has a function as a silane coupling agent, and thus the adhesion between a metal and a resin is likely to improve.

When the aromatic compound has a high molecular weight, the solubility in water or an organic solvent may decrease, or the adhesion of the coating film to a metal surface may decrease. Therefore, the molecular weight of the aromatic compound is preferably 1,500 or less, more preferably 1,200 or less, and still more preferably 1,000 or less.

(Specific Examples of Aromatic Compound)

As examples of the aromatic compound, imidazole silane compounds represented by the following general formulae (I) and (II) can be mentioned (e.g., JP 2015-214743 A).

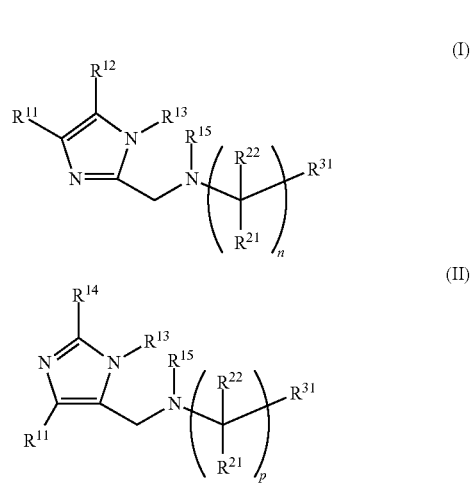

$R^{11}$ to $R^{15}$ in general formulae (I) and (II) are each independently a hydrogen atom or a $C_{1-20}$ alkyl group, an allyl group, a benzyl group, or an aryl group. $R^{21}$ and $R^{22}$ each independently represent a hydrogen atom, a $C_{1-4}$ alkyl group, a hydroxy group, or a methoxy group, and p is an integer of 0 to 16. $R^{31}$ is a primary amino group ($-NH_2$) or an alkoxysilyl group or hydroxysilyl group represented by $-Si(OR^{41})_k R^{42}_{(3-k)}$ (k is an integer of 1 to 3, and $R^{41}$ and $R^{42}$ are each independently a hydrogen atom or a $C_{1-6}$ alkyl group).

As represented by the following general formula (III), a silane compound having a triazole ring as a nitrogen-containing aromatic ring may also be suitably used as the aromatic compound (e.g., JP 2016-56449 A).

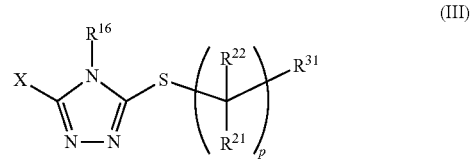

$R^{21}$, $R^{22}$, $R^{31}$, and p in general formula (III) are as defined for the above general formulae (I) and (II). $R^{16}$ is a hydrogen atom, a $C_{1-20}$ alkyl group, an allyl group, a benzyl group, or an aryl group. X is a hydrogen atom, a methyl group, $-NH_2$, $-SH$, or $-SCH_3$, and particularly preferably $-NH_2$.

As the aromatic compound, a compound having a triazine ring may also be suitably used. The following general formula (IV) is an example of the aromatic compound having a triazine ring and an amino group, wherein substituents are present on 2-, 4-, and 6-positions of 1,3,5-triazine, and at least one of them has a terminal amino group.

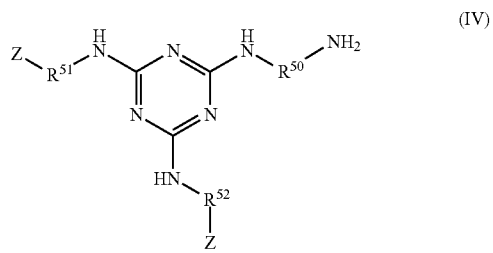

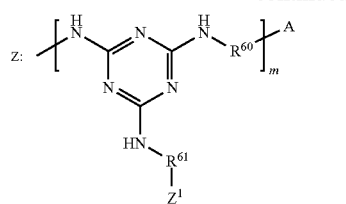

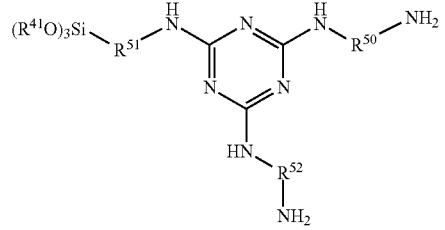

In the above general formula (IV), $R^{50}$, $R^{51}$, $R^{52}$, $R^{60}$, and $R^{61}$ are each independently an arbitrary divalent group, such as a substituted or unsubstituted alkylene group optionally having a $C_{1-6}$ branch. The alkylene group may contain ether, carbonyl, carboxy, amide, imide, carbamide, carbamate, or the like at the terminal or between carbons. $Z^1$ is the same group as Z. m and n are each independently an integer of 0 to 6. The terminal group A is a hydrogen atom, a primary amino group ($-NH_2$), or an alkoxysilyl group or hydroxysilyl group represented by $-Si(OR^{41})_k R^{42}_{(3-k)}$ (k is an integer of 1 to 3, and $R^{41}$ and $R^{42}$ are each independently a hydrogen atom or a $C_{1-6}$ alkyl group).

A compound of general formula (IV) wherein two Zs are each m=0, and the terminal group A is an amino group, is represented by the following formula (V).

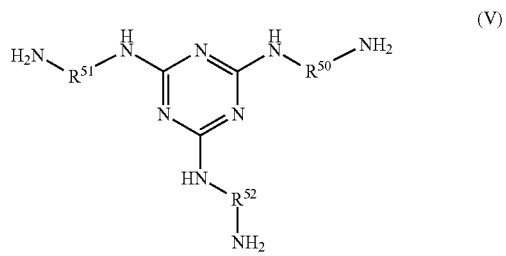

The compound of the above general formula (V) is obtained, for example, by allowing cyanuric halide to react with three molar equivalents of an alkylene diamine. In the case where one amino group of the alkylene diamine reacts with cyanuric halide, while the other amino group remains unreacted, as in the above formula (V), a derivative having an amino group at the terminal is obtained. When both of the amino groups of the alkylene diamine react with cyanuric halide, an aromatic compound having a plurality of triazine rings (a compound wherein m in Z is 1 or more) is produced.

When the polymerization degree of the triazine derivative represented by the above general formula (IV) increases, the solubility in water or an organic solvent may decrease. Therefore, in the synthesis of a triazine derivative having an amino group at the terminal, it is preferable to use an excess of alkylene diamine relative to cyanuric halide.

A compound of general formula (IV) wherein one of the two Zs is m=0, and the terminal group A is an amino group, while the other Z is m=0, and the terminal group A is a trialkoxysilyl group, is represented by the following formula (VI).

The compound represented by the above general formula (VI) is a silane coupling agent having a triazine ring and an amino group, and can be obtained by the method described in WO 2013/186941, for example.

As an aromatic compound having a triazine ring, in addition to those mentioned above, as represented by the following general formulae (VII) and (VIII), a compound wherein an alkylenethio group is bonded to a triazine ring can be mentioned (e.g., JP 2016-37457 A), for example.

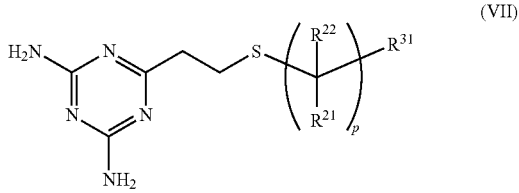

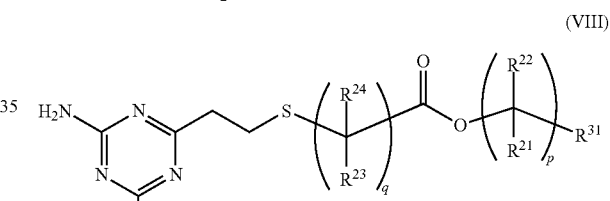

In the above general formulae (VII) and (VIII), $R^{21}$ to $R^{24}$ each independently represent a hydrogen atom, a $C_{1-4}$ alkyl group, a hydroxy group, or a methoxy group. $R^{31}$ is a primary amino group ($-NH_2$) or an alkoxysilyl group or hydroxysilyl group represented by $-Si(OR^{41})_k R^{42}_{(3-k)}$ (k is an integer of 1 to 3, and $R^{41}$ and $R^{42}$ are each independently a hydrogen atom or a $C_{1-6}$ alkyl group). p is an integer of 0 to 16, and q is 1 or 2.

Although a silane compound having an imidazole ring, a silane compound having a triazole ring, and a compound having a triazine ring have been mentioned as examples of the aromatic compound, the aromatic compound in the coating film-forming composition is not limited to the example compounds mentioned above, as long as it has an amino group and an aromatic ring in one molecule.

(Content of Aromatic Compound)

The content of the aromatic compound in the coating film-forming composition is not particularly limited. In terms of achieving both film formability on a metal surface and solution stability, the content of the aromatic compound is preferably 0.1 to 10 wt %, more preferably 0.2 to 5 wt %, and still more preferably 0.3 to 3 wt %.

<Polybasic Acid>

The polybasic acid functions to promote film formation together with halide ion and also contributes to the improvement in adhesion between a metal layer and a resin. The polybasic acid in the coating film-forming composition of the present invention is an organic acid having two or more carboxy groups. Examples of the polybasic acid include dicarboxylic acids such as oxalic acid, malonic acid, methylmalonic acid, succinic acid, methylsuccinic acid, glutaric acid, adipic acid, pimelic acid, suberic acid, azelaic acid, sebacic acid, hexafluoroglutaric acid, maleic acid, tartaric acid, diglycolic acid, phthalic acid, isophthalic acid, terephthalic acid, homophthalic acid, malic acid, 3,6-dioxaoctanedicarboxylic acid, mercaptosuccinic acid, thiodiglycolic acid, 1,2-phenylenedioxydiacetic acid, 1,2-phenylenediacetic acid, 1,3-phenylenediacetic acid, 1,4-phenylenediacetic acid, 1,4-phenylenedipropionic acid, and 4-carboxyphenoxyacetic acid; tricarboxylic acids such as citric acid, 1,2,3-propanetricarboxylic acid, 1,2,3-benzenetricarboxylic acid, 1,2,4-benzenetricarboxylic acid, 1,3,5-benzenetricarboxylic acid, 1,3,5-cyclohexanetricarboxylic acid, and 1-propene-1,2,3-tricarboxylic acid; tetracarboxylic acids such as 1,2,3,4-butanetetracarboxylic acid, tetrahydrofuran-2,3,4,5-tetracarboxylic acid, 1,2,4,5-benzenetetracarboxylic acid, 1,4,5,8-naphthalenetetracarboxylic acid, 1,2,3,4-cyclobutanetetracarboxylic acid, and 1,2,3,4-butanetetracarboxylic acid; and hexacarboxylic acids such as 1,2,3,4,5,6-cyclohexanehexacarboxylic acid and mellitic acid. Among them, divalent carboxylic acids (dicarboxylic acids), such as malonic acid and maleic acid, are preferable.

The content of the polybasic acid in the coating film-forming composition is 0.03 to 10 times the content of the above aromatic compound on a weight basis. When the content ratio between the aromatic compound and the polybasic acid is within this range, a coating film having excellent adhesion to a resin can be formed on a metal surface. The content of the polybasic acid is preferably 0.05 to 1 time, more preferably 0.08 to 0.8 times, and still more preferably 0.1 to 0.5 times, the content of the aromatic compound.

<Halide Ion>

The halide ion is a component that promotes film formation on a metal surface, and is preferably at least one kind selected from chloride ion, bromide ion, and iodide ion. In particular, because of excellent film formability, chloride ion is preferable. In the coating film-forming composition, two or more kinds of halide ions may be contained.

Examples of halide ion sources include hydrohalic acids such as hydrochloric acid and hydrobromic acid; sodium chloride, calcium chloride, potassium chloride, ammonium chloride, potassium bromide, sodium bromide, potassium iodide, sodium iodide, copper chloride, copper bromide, zinc chloride, iron chloride, and tin bromide. It is also possible to use two or more kinds of halide ion sources together.

The concentration of the halide ion in the coating film-forming composition is 5 to 600 mM. When the halide ion concentration is within this range, a stable coating film can be formed on a metal surface. In terms of enhancing film formability, the halide ion concentration in the coating film-forming composition is preferably 10 to 400 mM, and more preferably 20 to 200 mM.

<Solvent>

The coating film-forming composition of the present invention can be prepared by dissolving the above components in a solvent. The solvent is not particularly limited as long as the above components can be dissolved, and water, alcohols such as ethanol and isopropyl alcohol, esters, ethers, ketones, aromatic hydrocarbons and the like may be used. As water, water from which ionic matters and impurities have been removed is preferable. For example, ion exchange water, pure water, ultrapure water, and the like are preferably used.

<Other Components>

The coating film-forming composition of the present invention may also contain components other than those mentioned above. Examples of other components include surfactants, stabilizers, silane coupling agents, and pH adjusters. For example, in the case where the above aromatic compound does not have an alkoxysilyl group (i.e., in the case where the aromatic compound is not a silane coupling agent), the adhesion between a metal surface and a resin tends to improve when a silane coupling agent is contained as an additive. In addition, also in the case where the above aromatic compound is a silane coupling agent, another silane coupling agent may be contained as an additive in the coating film-forming composition.

The pH of the coating film-forming composition of the present invention is adjusted within a range of 6 to 9. The pH of the coating film-forming composition is more preferably 6.5 to 8. As a pH adjuster, various acids and alkalis may be used without particular limitation.

In the case where the above aromatic compound is a silane coupling agent having an alkoxysilyl group, the silane coupling agent may be partially or completely condensed in the coating film-forming composition of neutral pH range. However, when the condensation excessively proceeds, the silane coupling agent may be precipitated, resulting in a decrease in film formability. Therefore, even in the case where the silane coupling agent is condensed, the weight average molecular weight is preferably 1,500 or less, more preferably 1,200 or less, and still more preferably 1,000 or less, and it is preferable that the condensation degree is suppressed so that the weight average molecular weight will be within this range.

[Formation of Coating Film on Metal Member Surface]

The above coating film-forming composition is brought into contact with a surface of a metal member, and the solvent is removed by drying as necessary. As a result, as shown in FIG. 1, a coating film 12 is formed on a surface of the metal member 11. The coating film 12 is a film for improving adhesion to a resin. When the coating film is disposed on a surface of a metal member, the adhesion between the metal member and a resin improves.

Examples of metal members include the surface of a copper foil (electrolytic copper foil, rolled copper foil) used for electronic components such as semiconductor wafers, electronic substrates, and leadframes, decorative items, building materials, and the like, the surface of a copper-plated film (electroless copper-plated film, electrolytic copper-plated film), and also wire-shaped, rod-shaped, tube-shaped, and plate-shaped copper materials for various applications. In particular, the coating film-forming composition of the present invention has excellent film formability on a copper or copper alloy surface. Therefore, as the metal member, it is preferable to use a copper foil, a copper-plated film, a copper material, or the like.

The formation of a coating film on a surface of a metal member is performed under the following conditions, for example.

First, a surface of the metal member is washed with an acid or the like. Next, the metal surface is immersed in the above coating film-forming composition and subjected to an immersion treatment for about 2 second to 5 minutes. The temperature of the solution at this time is preferably about 10 to 50° C., and more preferably about 15 to 35° C. In the immersion treatment, shaking may be performed as necessary. Subsequently, the solvent is removed by drying, whereby a surface-treated metal member 10 having a coating film 12 on a surface of the metal member 11 is obtained.

The above coating film-forming composition has excellent film formability on a metal surface, and also the adsorption on a metal surface is high. Therefore, even when the metal member is washed with water after coating film formation, the film formation state on the metal surface is maintained. In addition, in the case where the coating film-forming composition is applied to a composite member of a metal and another material, a coating film can be selectively formed on a surface of the metal.

Although the coating film 12 is formed only on one side of the plate-shaped metal member 11 in FIG. 1, the coating film may also be formed on both sides of a metal member. It is preferable that the coating film is formed over the entire surface joined to a resin. The method for forming a coating film on a surface of a metal member is not limited to the immersion method, and it is possible to select a suitable application method such as spraying or bar coating.

[Metal-Resin Composite]

Figure 2:
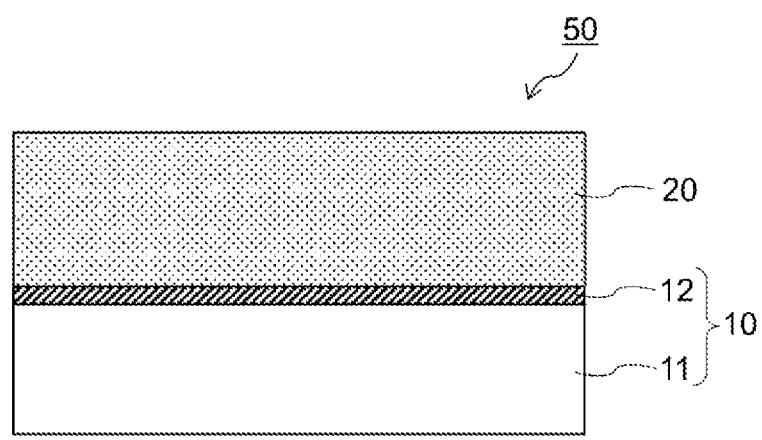
FIG. 2 is a schematic cross-sectional view showing one embodiment of a metal-resin composite.

Onto the coating film 12-formed surface of the surface-treated metal member 10, a resin member 20 is joined, whereby a metal-resin composite 50 shown in FIG. 2 is obtained. Although the resin member (resin layer) 20 is stacked only on one side of the plate-shaped metal member 11 with the coating film 12 therebetween in FIG. 2, the resin member may also be joined on both sides of a metal member.

As the method for joining the surface-treated metal member 10 and the resin member 20 together, it is possible to employ a method such as lamination pressing, lamination, coating, injection molding, or transfer molding. For example, by laminating a resin layer on a copper layer or copper alloy layer surface with an adhesive layer therebetween, a metal-resin laminate for use as a printed wiring board or the like is obtained.

The resin forming the above resin member is not particularly limited, and examples thereof include thermoplastic resins such as acrylonitrile/styrene copolymer resin (AS resin), acrylonitrile/butadiene/styrene copolymer resin (ABS resin), fluorine resin, polyamide, polyethylene, polyethylene terephthalate, polyvinylidene chloride, polyvinyl chloride, polycarbonate, polystyrene, polysulfone, polypropylene, and liquid crystal polymer, thermosetting resins such as epoxy resin, phenol resin, polyimide, polyurethane, bis-maleimide-triazine resin, modified polyphenylene ether, and cyanate ester, and UV-curable resins such as UV-curable epoxy resin and UV-curable acrylic resin. These resins may be modified with a functional group or may also be reinforced with, for example, glass fibers, aramid fibers, or other fiber.

The coating film formed on a metal surface using the coating film-forming composition of the present invention has excellent adhesion between the metal and a resin. Therefore, without additional layers therebetween, the resin member 20 can be directly joined onto the coating film 12 disposed on the metal member surface. In other words, when the coating film-forming composition of the present invention is used, without additional treatments, a metal-resin composite having high adhesion can be obtained by simply forming a coating film on a metal member surface, and joining a resin member directly thereonto.

Depending on the kind of resin material to be joined an adhesive layer made of a silane coupling agent or the like may be formed on the coating film 12. The coating film 12 formed on the metal surface has excellent adhesion to a resin. In addition, it also functions as an underlay for fixing an adhesive component, such as the silane coupling agent, to the metal surface. When an additional adhesive layer is disposed on the coating film formed on a metal surface using the coating film-forming composition of the present invention, the adhesion between the metal and a resin may be further improved.

EXAMPLES

Hereinafter, examples of the present invention will be described together with comparative examples. Incidentally, the present invention is not limited to the following examples.

[Preparation of Test Copper Foil]

An electrolytic copper foil (3EC-III manufactured by Mitsui Mining & Smelting Co., Ltd., thickness: 35 μm) cut to 100 mm×100 mm was immersed and shaken in a 6.25 wt % aqueous sulfuric acid solution at normal temperature for 20 seconds to perform a derusting treatment, then rinsed with water, and dried to give a test copper foil (test piece).

[Preparation of Solution]

The components shown in Table 1 were dissolved in ion exchange water to adjust blending quantity (concentrations), and then 1.0 N hydrochloric acid or a 1.0 N aqueous sodium hydroxide solution was added to make the pH shown in Table 1, thereby preparing a solution.

The silane coupling agent A is an imidazole-based silane coupling agent represented by the following formula, and a commercially available product (JX Metal IS1000) was used. In the following formula, $R^1$ to $R^4$ are each an alkyl group, and n is an integer of 1 to 3.

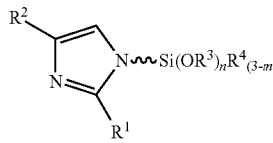

The silane coupling agent B is N,N'-bis(2-aminoethyl)-6-(3-triethoxysilylpropyl)amino-1,3,5-triazine-2,4-diamine represented by the following formula, and was synthesized in accordance with Example 1 of WO 2013/186941.

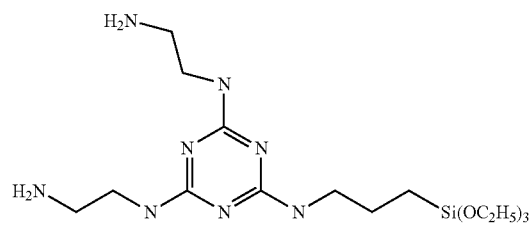

The silane coupling agent C is 5-(3-trimethoxysilylpropylsulfanyl)-4H-1,2,4-triazol-3-amine represented by the following formula, and was synthesized in accordance with Reference Example 1-2 of JP 2016-56449 A.

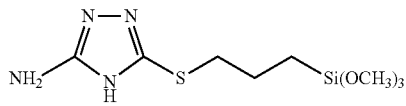

The silane coupling agent D is N-(1H-imidazol-2-ylmethyl)-3-trihydroxysilyl-propan-1-amine represented by the following formula, and was synthesized in accordance with Reference Example 1 of JP 2015-214743 A.

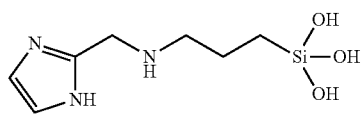 [SMILES: O[Si](O)(O)CCCNCc1ncc[nH]1]

The silane coupling agent E is N-phenyl-3-aminopropyltrimethoxysilane represented by the following formula, and a commercially available product (Shin-Etsu Silicone KBM-573) was used.

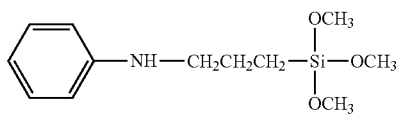

The silane coupling agent F is N-(2-aminoethyl)-3-aminopropyltrimethoxysilane represented by the following formula, and a commercially available product (Shin-Etsu Silicone KBM-603) was used.

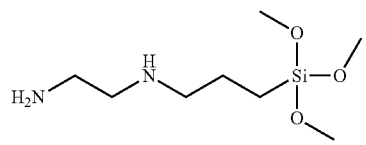

The "melamine-based compound" is a compound represented by the following formula, and was synthesized in the following synthesis example.

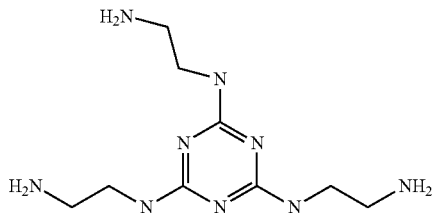 [SMILES: NCCNc1nc(NCCN)nc(NCCN)n1]

<Synthesis Example of Melamine-Based Compound>

To a THF solution of anhydrous ethylenediamine (1.5 mol) maintained at 50 to 55° C., a THF solution of cyanuric chloride (0.1 mol) was added dropwise. Subsequently, the mixture was allowed to react for 3 hours at 50 to 55° C. and then cooled to 20° C. An aqueous sodium hydroxide solution and isopropyl alcohol were added to the reaction solution, and the solvent was distilled off. Subsequently, dehydrated ethanol was added, and the precipitated sodium chloride was separated by filtration. The ethanol and ethylenediamine were distilled off from the filtrate, thereby giving a syrup-like reaction product.

[Evaluation]

<Film Formability>

The test piece was immersed in the solution (25° C.) of Table 1 for 30 seconds, then drained, and air-dried at room temperature for 3 minutes. Subsequently, the test piece was rinsed with water and dried. The film formability was evaluated based on the visual change in color tone and also on the presence of an organic component-derived peak in the infrared absorption (reflective absorption) spectrum. When changes in color tone were seen on the copper foil surface, and also an organic component-derived peak was observed, the film formability was rated as "good", while when changes in color tone were seen, but an organic component-derived peak was not observed (the copper foil surface was only eroded, and no film was formed), the film formability was rated as "poor".

<Resist Adhesion>

A dry film resist having a thickness of 20 μm was allowed to closely adhere to a test piece that had been subjected to the above coating film formation treatment, and then UV light having an integrated light intensity of 100 mJ was applied to photo-cure the resist. Cuts were formed in the surface of the cured resist at intervals of 1 cm, followed by immersion in 6N hydrochloric acid for 10 minutes. After rinsing with water and drying, an adhesive tape was attached to the resist surface and then peeled off, and the adhesion between copper and the resist was evaluated into the following four grades.

4: The resist-copper adhesion state is maintained, and the resist does not transfer to the tape side.

3: The resist comes off from copper along the cut parts and transfers to the tape side.

2: In the cut parts and their peripheries, the resist comes off from copper and transfers to the tape side.

1: Not only in the cut parts and their peripheries, the resist comes off from copper and transfers to the tape side.

Table 1 shows the compositions of the solutions of examples and comparative examples, together with the evaluation results.

TABLE 1

| | Composition | | | | | |
|---|---|---|---|---|---|---|
| | Component Name | Amount (wt %) | pH | Halogen (mM) | Film Formation | Adhesion |
| Example 1 | Histidine | 1 | 7.0 | 30 | Good | 3 |
| | Malonic acid | 1 | | | | |
| | Potassium iodide | 0.5 | | | | |
| Example 2 | Melamine-based compound | 1 | 6.0 | 5 | Good | 3 |
| | Citric acid | 2 | | | | |
| | Potassium bromide | 0.06 | | | | |
| Example 3 | Melamine-based compound | 1 | 6.5 | 25 | Good | 4 |
| | Citric acid | 0.3 | | | | |
| | Potassium bromide | 0.3 | | | | |

TABLE 1-continued

| | Composition | | | | | |
|---|---|---|---|---|---|---|
| | Component Name | Amount (wt %) | pH | Halogen (mM) | Film Formation | Adhesion |
| Example 4 | Silane coupling agent A | 1 | 6.5 | 600 | Good | 2 |
| | Maleic acid | 0.05 | | | | |
| | Ammonium chloride | 3.21 | | | | |
| Example 5 | Silane coupling agent A | 1 | 7.0 | 41 | Good | 4 |
| | Malonic acid | 0.1 | | | | |
| | Ammonium chloride | 0.22 | | | | |
| Example 6 | Silane coupling agent B | 1 | 7.5 | 34 | Good | 4 |
| | Malonic acid | 0.5 | | | | |
| | Sodium chloride | 0.2 | | | | |
| Example 7 | Silane coupling agent B | 1 | 8.0 | 204 | Good | 4 |
| | Citric acid | 0.1 | | | | |
| | Ammonium chloride | 1.09 | | | | |
| Example 8 | Silane coupling agent B | 1 | 8.5 | 325 | Good | 2 |
| | Citric acid | 10 | | | | |
| | Sodium chloride | 1.9 | | | | |
| Example 9 | Silane coupling agent C | 1 | 7.0 | 42 | Good | 4 |
| | Maleic acid | 1 | | | | |
| | Potassium bromide | 0.5 | | | | |
| Example 10 | Silane coupling agent D | 1 | 8.0 | 171 | Good | 3 |
| | Malonic acid | 1 | | | | |
| | Sodium chloride | 1 | | | | |
| Example 11 | Silane coupling agent E | 1 | 9.0 | 56 | Good | 2 |
| | Malic acid | 0.2 | | | | |
| | Ammonium chloride | 0.3 | | | | |
| Comparative Example 1 | Silane coupling agent F | 1 | 7.0 | 86 | Poor | 1 |
| | Malonic acid | 0.3 | | | | |
| | Sodium chloride | 0.5 | | | | |
| Comparative Example 2 | Melamine-based compound | 1 | 5.0 | 25 | Poor | 1 |
| | Malonic acid | 0.3 | | | | |
| | Potassium bromide | 0.3 | | | | |
| Comparative Example 3 | Melamine-based compound | 1 | 9.5 | 25 | Poor | 1 |
| | Malonic acid | 0.3 | | | | |
| | Potassium bromide | 0.3 | | | | |
| Comparative Example 4 | Melamine-based compound | 1 | 7.0 | 856 | Poor | 1 |
| | Malonic acid | 0.3 | | | | |
| | Sodium chloride | 5 | | | | |
| Comparative Example 5 | Silane coupling agent A | 1 | 7.0 | 25 | Good | 1 |
| | Maleic acid | 20 | | | | |
| | Potassium bromide | 0.3 | | | | |
| Comparative Example 6 | Silane coupling agent A | 1 | 7.0 | 0 | Poor | 1 |
| | Maleic acid | 0.05 | | | | |
| | Sodium sulfate | 0.2 | | | | |
| Comparative Example 7 | Silane coupling agent B | 1 | 7.0 | 25 | Good | 1 |
| | Acetic acid | 0.5 | | | | |
| | Potassium bromide | 0.3 | | | | |
| Comparative Example 8 | Silane coupling agent B | 1 | 7.0 | 2 | Poor | 1 |
| | Malonic acid | 0.2 | | | | |
| | Sodium chloride | 0.01 | | | | |
| Comparative Example 9 | Silane coupling agent B | 1 | 7.0 | 325 | Poor | 1 |
| | Malonic acid | 0.01 | | | | |
| | Sodium chloride | 1.9 | | | | |

As shown in Table 1, in all of Examples 1 to 11, a coating film was formed on the metal surface. In contrast, in Comparative Example 1 where the silane coupling agent F having no aromatic ring was used, no coating film was formed.

In Comparative Examples 2, 3, and 4, although the same melamine-based compound as in Examples 2 and 3 was used as an aromatic compound, no coating film was formed. The low pH in Comparative Example 2, or the high pH in Comparative Example 3, is considered to have caused a decrease in film formability. In Comparative Example 4, the high halide ion concentration is considered to be the cause of a decrease in film formability.

In Comparative Example 6 where the same aromatic compound as in Examples 4 and 5 (silane coupling agent A) was used, and in Comparative Examples 8 and 9 where the same aromatic compound as in Examples 6 to 8 (silane coupling agent B) was used, no coating film was formed. In Comparative Examples 6 and 8, the low halide ion concentration is considered to be the cause of a decrease in film formability. In Comparative Example 9, the small amount of polybasic acid is considered to be the cause of a decrease in film formability.

In all of Comparative Examples 1 to 4, 6, 8, and 9 where no coating film was formed on the copper foil surface, the adhesion between the copper foil and the dry film resist was low. Meanwhile, in Comparative Examples 5 and 6, although a coating film was formed, the adhesion between the copper foil and the dry film resist was low as in the case where no coating film was formed. In Comparative Example 5, the large amount of polybasic acid is considered to be the cause of a decrease in adhesion. In Comparative Example 7, no polybasic acid was used, and acetic acid, which is a monocarboxylic acid, was used; this is considered to be the cause of a decrease in adhesion.

In all of Examples 1 to 11, the score of the evaluation of adhesion between copper and a resist was 2 or more, indicating excellent adhesion. In these examples, even in the case where the aromatic compound used was the same, when the amounts of a polybasic acid and a halide were changed, differences occurred in the score of adhesion. These results show that by adjusting the concentrations of polybasic acid and halide ion blended with the aromatic compound, film formability on a metal surface can be improved, making it possible to form a composite with excellent metal-resin adhesion.

The invention claimed is:

1. A coating film-forming composition that is capable of forming a coating film on a metal surface for improving adhesion to a resin,
   the composition comprising: an aromatic compound having an amino group and an aromatic ring in one molecule; a polybasic acid having two or more carboxy groups; and a halide ion, wherein
   the content of the polybasic acid is 0.05 to 10 times the content of the aromatic compound,
   the concentration of the halide ion is 5 to 600 mM, and
   the coating film-forming composition is a solution of pH 6 to 9.

2. The coating film-forming composition according to claim 1, wherein the polybasic acid is a divalent carboxylic acid.

3. The coating film-forming composition according to claim 1, wherein the aromatic ring of the aromatic compound is a nitrogen-containing aromatic ring.

4. The coating film-forming composition according to claim 1, wherein the aromatic compound has a primary amino group or a secondary amino group.

5. A method for producing a surface-treated metal member, comprising bringing the coating film-forming composition according to claim 1 into contact with a surface of a metal member, thereby forming a coating film on the surface of the metal member.

6. The method for producing a surface-treated metal member according to claim 5, wherein the metal member is copper or a copper alloy.

7. A method for producing a metal-resin composite, comprising forming a coating film on a surface of a metal member by the method according to claim 5, and then joining a resin member onto the coating film.

* * * * *